(12) United States Patent
Liau et al.

(10) Patent No.: US 12,381,581 B2
(45) Date of Patent: Aug. 5, 2025

(54) USING ERASURE CODING ON PARTIAL CODE BLOCK COMMUNICATION INTERRUPTION

(71) Applicant: Hughes Network Systems, LLC, Germantown, MD (US)

(72) Inventors: Victor Liau, Germantown, MD (US); Mustafa Eroz, Germantown, MD (US); Lin-Nan Lee, Potomac, MD (US)

(73) Assignee: Hughes Network Systems, LLC, Germantown, MD (US)

(*) Notice: Subject to any disclaimer, the term of this patent is extended or adjusted under 35 U.S.C. 154(b) by 69 days.

(21) Appl. No.: 18/528,689

(22) Filed: Dec. 4, 2023

(65) Prior Publication Data
US 2025/0183918 A1 Jun. 5, 2025

(51) Int. Cl.
*H03M 13/37* (2006.01)
*H03M 13/11* (2006.01)

(52) U.S. Cl.
CPC ..... *H03M 13/373* (2013.01); *H03M 13/1154* (2013.01)

(58) Field of Classification Search
None
See application file for complete search history.

(56) References Cited

U.S. PATENT DOCUMENTS

| | | | | |
|---|---|---|---|---|
| 5,812,603 A * | 9/1998 | Luthi | ..... | H04L 1/0065 714/752 |
| 9,397,704 B2 * | 7/2016 | Eroz | ..... | H04L 1/0041 |
| 10,826,539 B2 * | 11/2020 | Xi | ..... | H04L 1/1671 |
| 11,042,439 B1 * | 6/2021 | Sridhara | ..... | H03M 13/2912 |
| 2023/0396362 A1 * | 12/2023 | Shin | ..... | H04L 1/0057 |

* cited by examiner

*Primary Examiner* — Guerrier Merant
(74) *Attorney, Agent, or Firm* — Capitol City TechLaw; Jasbir Singh

(57) ABSTRACT

A system and method for recovering from communication interruptions by a periodic blockage. This is achieved by selecting an inner code block rate that supports a Packet Error Ratio (PER) equal to or greater than a target PER during the blockage. An expected number of erasures is estimated and an outer code block rate capable of correcting an erasure ratio is chosen. The input is encoded using the outer code block rate to form an outer code block. One or more inner code blocks are formed by encoding segments of the outer code block using the inner code block rate. These inner code blocks are then transmitted. The count of inner code blocks is greater than 1, and the PER is a ratio of the expected number of erasures to the count of inner code blocks.

14 Claims, 3 Drawing Sheets

| Code rate n/9 | # inner block in large outer code block | 148.5 ksym/s Burst duration (s) | Latency or Outer block duration (s) | # blade cuts per outer code block | Target PER | Expected Erasure | Erasure Rate |
|---|---|---|---|---|---|---|---|
| 7 | 24.0 | 0.01853 | 0.4448 | 12.25 | 0.1 | 1.3 | 0.0833 |
| 6 | 28.0 | 0.01853 | 0.5189 | 14.29 | 0.1 | 1.5 | 0.0714 |
| 5 | 33.6 | 0.01853 | 0.6227 | 17.14 | 0.1 | 1.8 | 0.0595 |
| 4 | 42.0 | 0.01853 | 0.7783 | 21.43 | 0.1 | 2.2 | 0.0714 |

| Code rate n/9 | # inner block in large outer code block | 142.22 ksym/s Burst duration (s) | Latency or Outer block duration (s) | # blade cuts per outer code block | Target PER | Expected Erasure | Erasure Rate |
|---|---|---|---|---|---|---|---|
| 7 | 24.0 | 0.01935 | 0.4644 | 12.79 | 0.1 | 1.3 | 0.0833 |
| 6 | 28.0 | 0.01935 | 0.5418 | 14.92 | 0.1 | 1.5 | 0.0714 |
| 5 | 33.6 | 0.01935 | 0.6502 | 17.90 | 0.1 | 1.8 | 0.0595 |
| 4 | 42.0 | 0.01935 | 0.8127 | 22.38 | 0.1 | 2.3 | 0.0714 |

| Code rate n/9 | # inner block in small outer code block | 148.5 ksym/s Burst duration (s) | Latency or Outer block duration (s) | # blade cuts per outer code block | Target PER | Expected Erasure | Erasure Rate |
|---|---|---|---|---|---|---|---|
| 7 | 12.0 | 0.01853 | 0.2224 | 6.12 | 0.1 | 0.7 | 0.0833 |
| 6 | 14.0 | 0.01853 | 0.2594 | 7.14 | 0.1 | 0.8 | 0.0714 |
| 5 | 16.8 | 0.01853 | 0.3113 | 8.57 | 0.1 | 0.9 | 0.0595 |
| 4 | 21.0 | 0.01853 | 0.3892 | 10.72 | 0.1 | 1.1 | 0.0952 |

| Code rate n/9 | # inner block in small outer code block | 142.22 ksym/s Burst duration (s) | Latency or Outer block duration (s) | # blade cuts per outer code block | Target PER | Expected Erasure | Erasure Rate |
|---|---|---|---|---|---|---|---|
| 7 | 12.0 | 0.01935 | 0.2322 | 6.39 | 0.1 | 0.7 | 0.0833 |
| 6 | 14.0 | 0.01935 | 0.2709 | 7.46 | 0.1 | 0.8 | 0.0714 |
| 5 | 16.8 | 0.01935 | 0.3251 | 8.95 | 0.1 | 0.9 | 0.0595 |
| 4 | 21.0 | 0.01935 | 0.4064 | 11.19 | 0.1 | 1.2 | 0.0952 |

| Code rate n/9 | # inner block in large outer code block | 148.5 ksym/s Burst duration (s) | Latency or Outer block duration (s) | # blade cuts per outer code block | Target PER | Expected Erasure | Erasure Rate |
|---|---|---|---|---|---|---|---|
| 7 | 24.0 | 0.01853 | 0.4448 | 12.25 | 0.1 | 1.3 | 0.0833 |
| 6 | 28.0 | 0.01853 | 0.5189 | 14.29 | 0.1 | 1.5 | 0.0714 |
| 5 | 33.6 | 0.01853 | 0.6227 | 17.14 | 0.1 | 1.8 | 0.0595 |
| 4 | 42.0 | 0.01853 | 0.7783 | 21.43 | 0.1 | 2.2 | 0.0714 |

| Code rate n/9 | # inner block in large outer code block | 142.22 ksym/s Burst duration (s) | Latency or Outer block duration (s) | # blade cuts per outer code block | Target PER | Expected Erasure | Erasure Rate |
|---|---|---|---|---|---|---|---|
| 7 | 24.0 | 0.01935 | 0.4644 | 12.79 | 0.1 | 1.3 | 0.0833 |
| 6 | 28.0 | 0.01935 | 0.5418 | 14.92 | 0.1 | 1.5 | 0.0714 |
| 5 | 33.6 | 0.01935 | 0.6502 | 17.90 | 0.1 | 1.8 | 0.0595 |
| 4 | 42.0 | 0.01935 | 0.8127 | 22.38 | 0.1 | 2.3 | 0.0714 |

FIG. 1A

| Code rate n/9 | # inner block in small outer code block | 148.5 ksym/s Burst duration (s) | Latency or Outer block duration (s) | # blade cuts per outer code block | Target PER | Expected Erasure | Erasure Rate |
|---|---|---|---|---|---|---|---|
| 7 | 12.0 | 0.01853 | 0.2224 | 6.12 | 0.1 | 0.7 | 0.0833 |
| 6 | 14.0 | 0.01853 | 0.2594 | 7.14 | 0.1 | 0.8 | 0.0714 |
| 5 | 16.8 | 0.01853 | 0.3113 | 8.57 | 0.1 | 0.9 | 0.0595 |
| 4 | 21.0 | 0.01853 | 0.3892 | 10.72 | 0.1 | 1.1 | 0.0952 |

| Code rate n/9 | # inner block in small outer code block | 142.22 ksym/s Burst duration (s) | Latency or Outer block duration (s) | # blade cuts per outer code block | Target PER | Expected Erasure | Erasure Rate |
|---|---|---|---|---|---|---|---|
| 7 | 12.0 | 0.01935 | 0.2322 | 6.39 | 0.1 | 0.7 | 0.0833 |
| 6 | 14.0 | 0.01935 | 0.2709 | 7.46 | 0.1 | 0.8 | 0.0714 |
| 5 | 16.8 | 0.01935 | 0.3251 | 8.95 | 0.1 | 0.9 | 0.0595 |
| 4 | 21.0 | 0.01935 | 0.4064 | 11.19 | 0.1 | 1.2 | 0.0952 |

FIG. 1B

USING ERASURE CODING ON PARTIAL CODE BLOCK COMMUNICATION INTERRUPTION

FIELD

A code block may be modulation encoded prior to communication. Segments of a code block may be individually modulation encoded using an inner encoding while the encoded segments as a whole are encoded with an outer encoding for the code block. Portions of a code block communication may be erased by periodic disruptions such as helicopter blade blockages.

An outer code encoding can correct erasure rate caused by helicopter blade blockage. Each outer code block holds information bits of multiple inner code blocks. By selecting an outer code block code rate capable of correcting the erasure ratio of the expected erasures from the total number of inner code blocks within the outer code block erased or partially erased inner code blocks may be recovered. The outer encoding rate is higher than the inner encoding rate. By lowering the inner code rate, less symbols of the inner code blocks are lost. Given Clear Sky Es/No and blockage duration, an inner code rate to allow the target PER (e.g., $10^{-1}$) when blocked is selected. As such, erased or partially erased inner code blocks are recovered by the outer code block decoding.

BACKGROUND

A line of sight (LOS) transmission through rotary blades of helicopters introduces a signal distortion due to periodic blockages caused by spinning rotor blades. The magnitude of the distortion depends on various factors, such as, antenna mounting locations, helicopter attitude during maneuvering, number of blades, signal frequency, or the like. experiences. Due to the wavelength difference between Ka-band and L-band signals, an attenuation by the blade blocking in L-band is smaller than an attenuation by the blade blocking in Ka-band. Attenuation of 4~6 dB due to the rotor's blades has been noted in the L-band. Attenuation of ~15 dB due to the rotor's blades has been noted in the Ka-band. Some prior art noted that a blockage attenuation of up to 8 dB may occur when an omni antenna was placed just 20 cm vertically and 0 cm horizontally below the blade. An attenuation for mid and high gain antennae due to diffraction over multiple elements in the antenna has been noted. Blockage periodicity as short as 29 ms and blockage duration up to 18 ms were suggested for the blade blockage modeling.

A physical interruption duration, such as that from spinning helicopter blades, is generally constant. For narrow-band channel with low symbol rates, such blade interruption duration may corrupt only a fraction of a code block rather than the whole code block in entirety. The present teachings recover from periodic blockages causing partial code block erasures. The prior art aimed to solve scenarios where communication interruption spanned a duration longer than an inner code block transmission. However, while physical interruption duration such as that from helicopter blades does not change, for narrow-band channel with low symbol rates, such blade interruption duration may corrupt only a fraction of a code block rather than the whole code block in entirety. Therefore, there is a need for a method that can effectively recover from communication interruptions caused by periodic blockages, without discarding the outer block and its contents for partial code block erasures.

The present teachings recover from communication interruption for partial code block erasures by utilizing the outer erasure code when the inner code block has been partially corrupted. Moreover, the present teachings provide a flexible and adaptable solution that can be tailored to suit different communication scenarios.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

In some aspects, the techniques described herein relate to a method for recovering from communication interruptions by a periodic blockage, the method including: selecting an inner code block rate supporting a Packet Error Ratio (PER) greater than or equal to a target PER during the periodic blockage; estimating an expected number of erasures based on a count of the inner code blocks in an outer code block, a count of periodic blockages expected in a transmitting duration of the inner code blocks, and the target PER; choosing an outer code block rate capable of correcting an erasure ratio of the expected number of erasures to the count of the inner code blocks; encoding an input using the outer code block rate to form an outer code block; forming inner code blocks by individually encoding segments of the outer code block using the inner code block rate; and transmitting the inner code blocks, wherein a count of inner code blocks is greater than 1, and the PER is a ratio of the expected number of erasures to the count of inner code blocks.

In some aspects, the techniques described herein relate to a method, wherein the expected number of erasures is based on a periodic blockage duration and a Clear Sky Energy per Symbol to Noise Power Spectral Density Ratio (Es/No).

In some aspects, the techniques described herein relate to a method, wherein the expected number of erasures in the transmitting duration is less than twice the count of periodic blockages in the transmitting duration.

In some aspects, the techniques described herein relate to a method, wherein the outer code block rate is greater than the inner code block rate.

In some aspects, the techniques described herein relate to a method, further including modulating the inner code blocks with a modulation scheme having a low symbol rate.

In some aspects, the techniques described herein relate to a method, wherein the inner code block rate allows recovery from a 10% loss rate and the outer code block rate allows recovery from a 20% loss rate.

In some aspects, the techniques described herein relate to a method, wherein there is either no interleaver or there is a simple interleaver in bits or in bytes between the encoding and the forming.

In some aspects, the techniques described herein relate to a method, further including decoding the inner code blocks; and recovering a partially erased inner code block of the decoded inner code blocks by decoding the decoded inner code blocks with the outer code.

In some aspects, the techniques described herein relate to a method, wherein the partially erased inner code block includes a whole inner code block of the inner code blocks.

In some aspects, the techniques described herein relate to a method, wherein the partially erased inner code block includes two adjacent inner code blocks of the inner code blocks.

In some aspects, the techniques described herein relate to a method, wherein the inner code block rate and the outer code block rate are selected based on the expected number of erasures and the count of inner code blocks.

In some aspects, the techniques described herein relate to a method, wherein the inner code blocks are formed by encoding segments of the outer code block using a plurality of inner code block rates.

In some aspects, the techniques described herein relate to a method, wherein the inner code blocks are transmitted sequentially.

In some aspects, the techniques described herein relate to a method, wherein the inner code blocks are of a constant duration.

In some aspects, the techniques described herein relate to a method for recovering a transmission from communication interruptions by a periodic blockage, the method including: receiving an outer code block including inner code blocks encoded with an inner block rate, wherein the outer code block is encoded with an outer code block rate; decoding the inner code blocks; and recovering a partially erased inner code block of the decoded inner code blocks by decoding the decoded inner code blocks with the outer code, wherein the inner code block rate supports a Packet Error Ratio (PER) greater than or equal to a target PER during a periodic blockage, the outer code block rate supports correcting an erasure ratio of an expected number of erasures to a count of the inner code blocks, a count of inner code blocks is greater than 1, and the PER is a ratio of the expected number of erasures to the count of inner code blocks.

In some aspects, the techniques described herein relate to a method, wherein the expected number of erasures is based on a periodic blockage duration and a Clear Sky Energy per Symbol to Noise Power Spectral Density Ratio (Es/No).

In some aspects, the techniques described herein relate to a method, wherein the expected number of erasures in a reception duration of the outer code block is less than twice the count of periodic blockages in the reception duration.

In some aspects, the techniques described herein relate to a method, wherein the outer code block rate is greater than the inner code block rate.

In some aspects, the techniques described herein relate to a method, wherein the encoding and the forming use Low-Density Parity-check (LPDC) encoding, and the outer block is either not de-interleaved prior to the recovering of the inner code blocks or is de-interleaved with a simple interleaving scheme.

In some aspects, the techniques described herein relate to a method, wherein the inner code blocks are decoded using a plurality of inner code block rates.

Additional features will be set forth in the description that follows, and in part will be apparent from the description, or may be learned by practice of what is described.

DRAWINGS

In order to describe the manner in which the above-recited and other advantages and features may be obtained, a more particular description is provided below and will be rendered by reference to specific embodiments thereof which are illustrated in the appended drawings. Understanding that these drawings depict only typical embodiments and are not, therefore, to be limiting of its scope, implementations will be described and explained with additional specificity and detail with the accompanying drawings.

FIG. 1A illustrates exemplary erasure rates for large outer code block sizes, according to various embodiments.

FIG. 1B illustrates exemplary erasure rates for small outer code block sizes, according to various embodiments.

Figure 2:
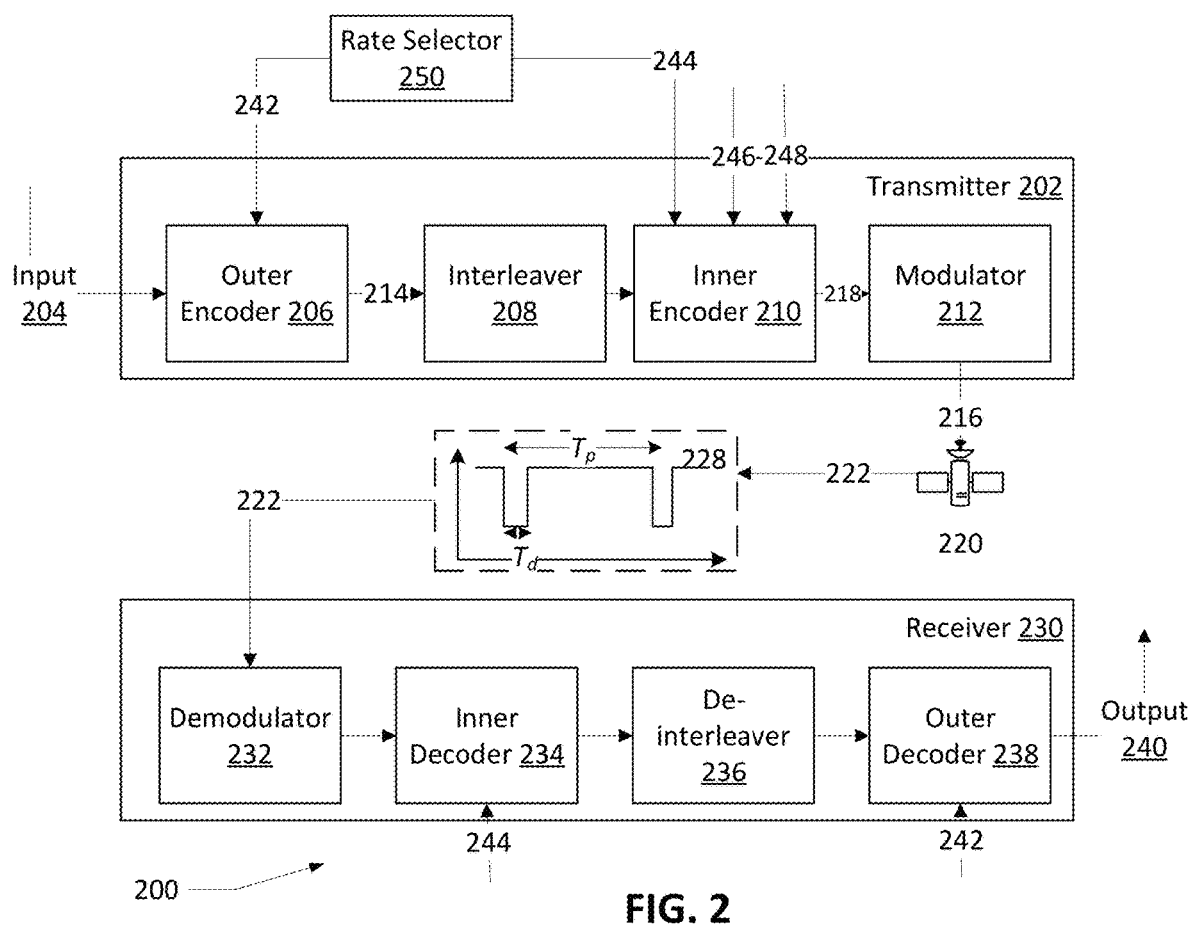
FIG. 2 illustrates a system to recover from communication interruptions by a periodic blockage according to various embodiments.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The present teachings may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment. Communication systems, such as, satellite communication systems, use error correction coding to add redundancy to the transmitted data, allowing the receiver to detect and correct errors that may occur during transmission. Concatenated coding is a type of error-correcting coding formed by a series combination of two or even more codes for example, a series combination of two different codes, namely an outer code an inner code. In some embodiments, concatenated coding/decoding can be performed by parallelly configured encoders and decoders. Inner codes are applied to smaller segments of the transmitted data, such as individual blocks or packets. These codes are designed to correct errors within each segment and are typically characterized by their ability to achieve a certain Packet Error Ratio (PER). The PER represents the ratio of the number of erroneous packets to the total number of packets transmitted. Outer codes, on the other hand, are applied to larger blocks of data, which may consist of multiple inner code blocks. These codes are designed to correct errors that cannot be corrected by the inner codes alone. The choice of the inner code block rate and the outer code block rate determines ability to correct errors introduced during transmission.

A code rate of a forward error correction code is the ratio of the information bits to the total transmitted bits. That is, if the code rate is k/n for every k bits of information, the coder generates a total of n bits of transmitted data, of which n-k are redundant. Lower proportion rates are more robust, for example, an 1/8 code rate is more robust than 4/5 code rate. Outer and inner code rates are exemplary code rates.

Exemplary error correcting codes include Low-density parity check (LPDC) and Turbo codes. Low-density parity-check (LDPC) codes are a class of highly efficient linear block codes made from many single parity check (SPC) codes. Turbo coding is an iterated soft-decoding scheme that combines two or more relatively simple convolutional codes and an interleaver to produce a block code that can perform to within a fraction of a decibel of the Shannon limit.

FIG. 1A illustrates exemplary erasure rates for large outer code block sizes, according to various embodiments.

FIG. 1B illustrates exemplary erasure rates for small outer code block sizes, according to various embodiments.

An exemplary helicopter may have four rotor blades spinning from 350 RPM to 413 RPM with a blade dimension of 0.9 feet width and 17.5 feet (length). At 413 RPM, a blade interval between periodic blockages would be 36.62 ms for antennae mounted on a weapons pylon, about 4.39 feet from a rotor center. The blockage duration due to rotors would vary from about 1.6 ms to 2.0 ms depending on an antenna azimuth angle. An exemplary satellite may support the following modulations, code rates and Es/No (dB) with a Packet Error Ratio (PER) of $10^{-4}$ for narrow channels, for example, a channel with a bandwidth of 156.25 KHz or the like.

| Mod | Code Rate | Es/No (dB) PER $10^{-4}$ |
|---|---|---|
| QPSK | 9/10 | 8.0 |
| | 4/5 | 6.0 |
| | 2/3 | 4.3 |
| | ½ | 2.5 |
| 16APSK | 4/5 | 13.2 |
| | 2/3 | 11.0 |
| 32APSK | 4/5 | 16.4 |
| | ¾ | 15.5 |

An exemplary burst may include a unique Word (UW), a payload, and pilots having the following count of symbols.

| Modulation | UW Length | Payload Sym | Pilot Sym Insert Interval | No Pilots | Total length (sym) | Overhead Rate |
|---|---|---|---|---|---|---|
| 8PSK | 256 | 2400 | 25 | 96 | 2752 | 0.1279 |

In some embodiments, a periodic blockage with different constant durations sliding across a payload (outer code block) may have a step size of 50 symbols given a 8PSK data rate in a 156.25 KHz channel (assuming a successful acquisition of the signal even when experiencing blockage). Exemplary 8PSK data rate at 148.5 ksym/s yields 258 kb/s at code rate of 2/3, and 302.2 kb/s at code rate of 7/9. Exemplary 8PSK data rate at 142.22 ksym/s yields 248.1 kb/s at code rate of 2/3, and 289.4 kb/s at code rate of 7/9.

An exemplary blade interval is 36.32 ms. Exemplary inner burst durations are 18.53 ms (at 148.5 ksym/s) or 19.35 ms (at 142.22 ksym/s). A larger code block implies longer latency. An exemplary outer code block of 134400 holds 24 inner blocks at R7/9, 28 inner blocks at R6/9, 33.6 inner blocks at R5/9, 42 inner blocks at R4/9. An exemplary outer code block of 67200 holds 12 inner blocks at R7/9, 14 inner blocks at R6/9, 16.8 inner blocks at R5/9, 21 inner blocks at R4/9. An Outer code rate R4/5 can correct approximately 17% erasure.

Observations of the present teachings have determined that, for 8PSK, an inner LDPC code may survive with acceptable PER (10-4) provided a sufficiently high clear sky Es/No, a narrow blockage duration, and an outer erasure code. In some embodiments, a blockage duration resiliency (e.g., up to the symbol blockage duration of 10-1 PER) may be increased with an appropriate outer code rate when clear sky Es/No is low. For example, an outer code rate 4/5 can correct erasures in the inner code blocks.

Exemplary minimum Clear Sky Es/Nos allowing target PER of 10-1 with 300-sym blockage and blade blockage loss of 7 dB are: 8PSK R7/9 with Es/No of 11 dB, 8PSK R6/9 with Es/No of 9.3 dB, 8PSK R5/9 with Es/No of 7.2 dB, and 8PSK R4/9 with an Es/No of 5.4 dB.

FIG. 2 illustrates a system to recover from communication interruptions by a periodic blockage according to various embodiments.

A system 200 may include components to recover from communication interruptions by a periodic blockage. The system may include a transmitter 202, a receiver 230 and optionally a relay 220 to provide line-of-sight connectivity between the transmitter 202 and receiver 230. The relay 220 may be a satellite, an airplane, a high-altitude platform, or a base station.

Communications between transmitter 202 and receiver 230 may use an uplink 216 between transmitter 202 and relay 220, and a downlink 222. Downlink 222 may suffer a periodic blockage of Td seconds every Tp seconds from a periodic blockage 228. An exemplary environment subject to periodic blockage is where line-of-sight between a transmitter and receiver is thru a travel path of a spinning blade, for example, a helicopter's spinning rotor. An exemplary helicopter may include a weapons pylon, antennae disposed on the weapons pylon and a 4-blade rotary blade disposed between relay 220 and the antennae. The 4-blade rotary blade may be spinning at 250 revolutions per minute and downlink 222 may experience a 5 dB attenuation due to the periodic blockage 228 by the spinning blade of 5 ms (Td) every 60 ms (Tp).

An input 204 to transmitter 202 may include information bits. Input 204 may be provided as code blocks. Transmitter 202 may process input 204 via an outer encoder 206, an interleaver 208, an inner encoder 210, and a modulator 212 to generate uplink 216. An outer code block 214 may be an output of outer encoder 206 using an outer code rate 242.

Multiple inner code blocks 218 may be an output of inner encoder 210 at an inner code rate 244. Inner encoder 210 may be provided parameter 246 indicating a count of block blockages in an outer code block duration. Inner encoder 210 may be provided parameter 248 indicating a target PER when blocked periodically.

Uplink 216 communicates multiple inner code blocks 218. Uplink 216 may be communicated to relay 220 via RF communications. Downlink 222 may be received by receiver 230. Downlink 222 may be attenuated by ambient conditions affecting uplink 216 and downlink 222. Receiver 230 may include demodulator 232, an inner decoder 234, a de-interleaver 236, and an outer decoder 238 to generate an output 240. Inner decoder 234 may be provided inner code rate 244 by a rate selector 250. Outer decoder 238 may be provided outer code rate 242 by rate selector 250. Output 240 corresponds to input 204.

Interleaver 208 can be at the bit or byte quantities. The interleaver 208 can be the simple rectangular interleaver where you write (in bits or in bytes) by the rows and read out (in bits or in bytes) by the columns.

Figure 3:
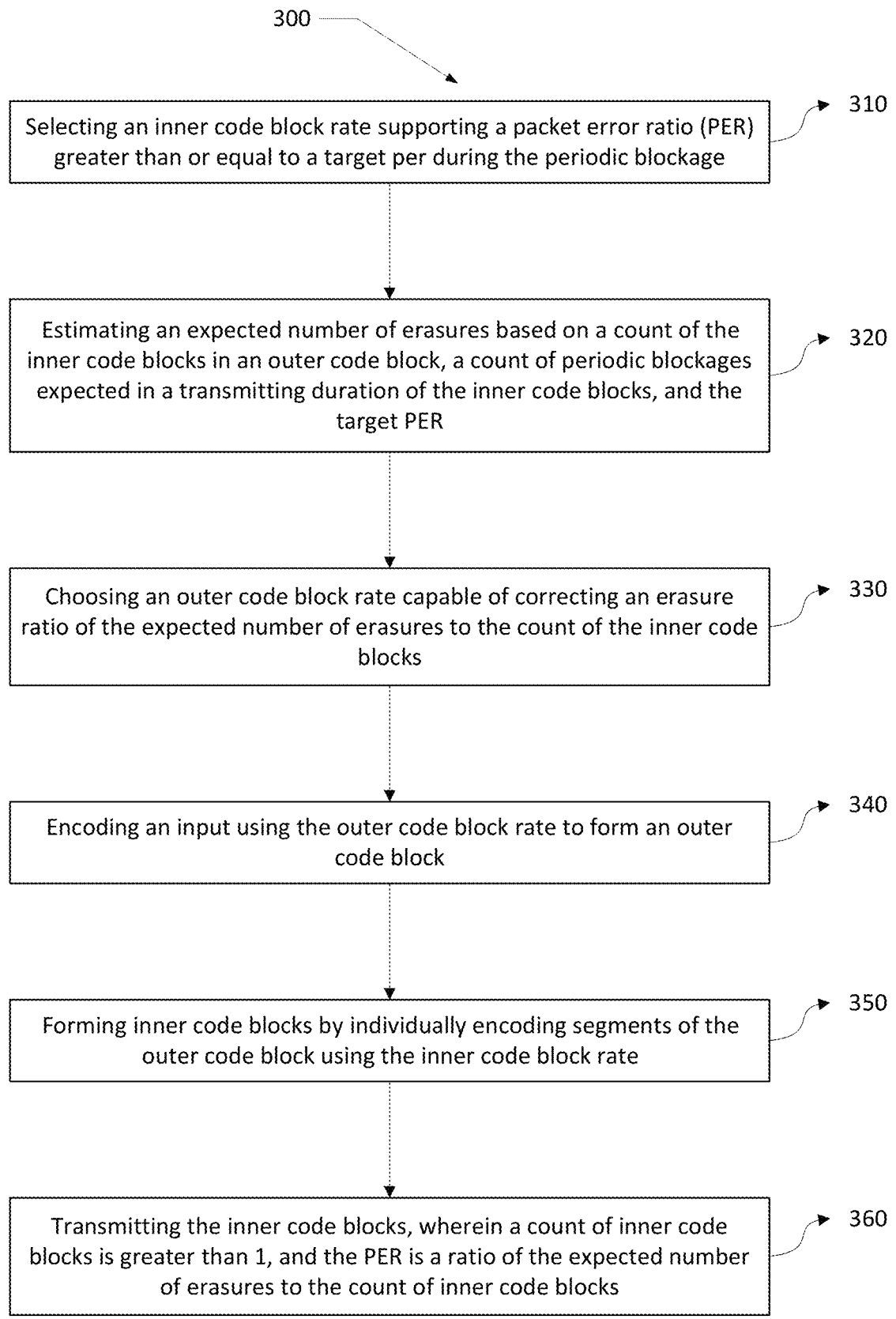
FIG. 3 illustrates an example of a method for recovering from communication interruptions caused by periodic blockages.

FIG. 3 illustrates an example of a method for recovering from communication interruptions caused by periodic blockages.

FIG. 3 illustrates a method 300 for recovering from communication interruptions caused by periodic blockages. In method 300 operations are performed by a system that includes a processor executing a set of codes to control functional elements of an apparatus. Alternatively, certain processes are performed using special-purpose hardware. Generally, these operations are performed according to the methods and processes described. In some cases, the operations described herein are composed of various sub-steps, or are performed in conjunction with other operations.

Method 300 includes operation 310 for estimating an expected number of erasures based on a count of the inner code blocks in an outer code block, a count of periodic blockages expected in a transmitting duration of the inner code blocks, and the target PER.

A number of blade cuts within an outer code block duration determines a number of affected inner bursts. The number of affected inner bursts may range between approximately the number of blade cuts and twice the number of blade cuts (when blockage occurs at burst boundaries). In an exemplary embodiment, assuming N inner bursts per outer code block duration, an inner code burst S sym long, each blade cut blocks b sym, and that a blade cuts uniformly throughout the outer code block, an outer code rate to correct the erasure rate is chosen.

Each blade cut causes at most one inner burst erasure on average. However, when blade cuts start later than sym S-b-1, the blade cuts affect two adjacent inner bursts. In adjacent inner bursts suffering erasures, fewer than b symbols are blocked or erased in either of the adjacent inner bursts. The b/2-sym PER much lower than b-sym PER, as about b/2 symbols blocking adjacent bursts. As such, on average, $$(\text{Expected erasures}) \approx (\text{\# blade cuts}) * (\text{target } PER)$$

Method 300 includes operation 320 for selecting an inner code block rate supporting a Packet Error Ratio (PER) greater than or equal to a target PER during the periodic blockage. Given Clear Sky Es/No and blockage duration, operation 320 selects an inner code rate to allow the target PER (e.g., 10^-1) when blocked, where the PER of the selected inner code rate is based on its ability to correct an erasure ratio of the expected number of erasures (estimated in operation 310) and the count of inner code blocks.

The following table lists exemplary code rates given clear sky Es/No conditions (without the periodic blockage).

| Modulation | 10-5 PER (dB) | Clear Sky Es/No (dB) | 10-1 PER (dB) (300 erased sym) |
|---|---|---|---|
| AMW 8PSK R7/9 | 9.1 | 12, 11, 10 | 11 |
| AMW 8PSK R6/9 | 7.3 | 12, 10.3, 9.3, 8.3 | 9.3 |
| AMW 8PSK R5/9 | 6 | 12, 9.0, 8.0, 7.0 | 7.2 |
| AMW 8PSK R4/9 | 4.2 | 7.2, 6.2, 6.2 (even with blockage, PER is at least 10-5 with clear sky Es/No of 12 dB) | 5.4 |

Method 300 includes operation 330 for choosing an outer code block rate capable of correcting an erasure rate of the expected number of erasures to the count of the inner code blocks. In some embodiments, operation 330 selects an outer code rate that can correct erasure rate calculated as (Expected erasures)/N. The Expected erasures may be calculated per operation 310. In some embodiments, the outer code rate may be chosen by rate selector 250.

Method 300 includes operation 340 for encoding an input using the outer code block rate to form an outer code block.

Method 300 includes operation 350 for forming inner code blocks by individually encoding segments of the outer code block using the inner code block rate.

Method 300 includes operation 360 for transmitting the inner code blocks, wherein a count of inner code blocks is greater than 1, and the PER is a ratio of the expected number of erasures to the count of inner code blocks.

Having described preferred embodiments of a system and method (which are intended to be illustrative and not limiting), it is noted that modifications and variations can be made by persons skilled in the art considering the above teachings. It is therefore to be understood that changes may be made in the embodiments disclosed which are within the scope of the invention as outlined by the appended claims.

Having thus described aspects of the invention, with the details and particularity required by the patent laws, what is claimed and desired protected by Letters Patent is set forth in the appended claims.

We claim as our invention:

1. A method for recovering from communication interruptions by a periodic blockage, the method comprising:
   selecting an inner code block rate supporting a Packet Error Ratio (PER) greater than or equal to a target PER during the periodic blockage;
   estimating an expected number of erasures based on a count of the inner code blocks in an outer code block, a count of periodic blockages expected in a transmitting duration of the inner code blocks, and the target PER;
   choosing an outer code block rate capable of correcting an erasure ratio of the expected number of erasures to the count of the inner code blocks;
   encoding an input using the outer code block rate to form an outer code block;
   forming inner code blocks by individually encoding segments of the outer code block using the inner code block rate; and
   transmitting the inner code blocks,
   wherein a count of inner code blocks is greater than 1, and the PER is a ratio of the expected number of erasures to the count of inner code blocks.

2. The method of claim 1, wherein the expected number of erasures is based on a periodic blockage duration and a Clear Sky Energy per Symbol to Noise Power Spectral Density Ratio (Es/No).

3. The method of claim 1, wherein the expected number of erasures in the transmitting duration is less than twice the count of periodic blockages in the transmitting duration.

4. The method of claim 1, wherein the outer code block rate is greater than the inner code block rate.

5. The method of claim 1, further comprising modulating the inner code blocks with a modulation scheme having a low symbol rate.

6. The method of claim 1, wherein the inner code block rate allows recovery from a 10% loss rate and the outer code block rate allows recovery from a 20% loss rate.

7. The method of claim 1, wherein there is either no interleaver or there is a simple interleaver in bits or in bytes between the encoding and the forming.

8. The method of claim 1, further comprising decoding the inner code blocks; and recovering a partially erased inner code block of the decoded inner code blocks by decoding the decoded inner code blocks with the outer code.

9. The method of claim 8, wherein the partially erased inner code block comprises a whole inner code block of the inner code blocks.

10. The method of claim 8, wherein the partially erased inner code block comprises two adjacent inner code blocks of the inner code blocks.

11. The method of claim 1, wherein the inner code block rate and the outer code block rate are selected based on the expected number of erasures and the count of inner code blocks.

12. The method of claim 1, wherein the inner code blocks are formed by encoding segments of the outer code block using a plurality of inner code block rates.

13. The method of claim 1, wherein the inner code blocks are transmitted sequentially.

14. The method of claim 1, wherein the inner code blocks are of a constant duration.

* * * * *